United States Patent
Fukui

(10) Patent No.: US 6,995,193 B1
(45) Date of Patent: Feb. 7, 2006

(54) PHOTOCURABLE COMPOSITION, PROCESS FOR PRODUCING PHOTOCURABLE COMPOSITION, PHOTOCURABLE PRESSURE-SENSITIVE ADHESIVE SHEET, PROCESS FOR PRODUCING PHOTOCURABLE PRESSURE-SENSITIVE ADHESIVE SHEET, AND METHOD OF BONDING

(75) Inventor: Hiroji Fukui, Kyoto (JP)

(73) Assignee: Sekisui Chemical Co., Ltd., Osaka (JP)

( * ) Notice: Subject to any disclaimer, the term of this patent is extended or adjusted under 35 U.S.C. 154(b) by 0 days.

(21) Appl. No.: 10/203,381

(22) PCT Filed: Feb. 14, 2000

(86) PCT No.: PCT/JP00/00803

§ 371 (c)(1),
(2), (4) Date: Aug. 9, 2002

(87) PCT Pub. No.: WO01/58979

PCT Pub. Date: Aug. 16, 2001

(51) Int. Cl.
*C08F 2/46* (2006.01)
*C08F 2/50* (2006.01)
*B32B 7/12* (2006.01)

(52) U.S. Cl. .................. 522/102; 522/100; 522/111; 522/110; 522/113; 522/120; 522/121; 522/122; 522/153; 522/154; 522/170; 522/181; 522/182; 522/150; 428/355 EN; 428/345; 428/355 AC; 428/57; 428/58; 427/508; 427/516; 427/207.1; 427/208.4; 427/208.6

(58) Field of Classification Search ................. 522/102, 522/15, 25, 66, 100, 110, 111, 113, 120, 121, 522/122, 150, 153, 154, 170, 181, 182; 428/57, 428/58, 355 EN, 345, 355 AC; 427/508, 427/516, 207.1, 208.4, 208.6
See application file for complete search history.

(56) References Cited

U.S. PATENT DOCUMENTS 6,376,070 B1 * 4/2002 Nakasuga et al.
6,465,537 B1 * 10/2002 Fukui et al. .................. 522/15
6,709,310 B1 * 3/2004 Pietrafesa

FOREIGN PATENT DOCUMENTS

| EP | 0819746 A2 * | 1/1998 |
|----|--------------|--------|
| EP | 0819746 A | 1/1998 |
| EP | 1249479 A | 10/2002 |
| JP | 2272076 | 11/1990 |
| JP | 5506465 | 9/1993 |
| JP | 9279103 | 10/1997 |

OTHER PUBLICATIONS

JP 9–279103, A English Abstracts thereof.
Japanese Patent Laying–Open No. 306140/1998 and English Abstracts thereof.
Japanese Patent Laying–Open No. 147754/1998 and English Abstracts thereof.
Japanese Patent Laying–Open No. 120988/1998 and English Abstracts thereof.

* cited by examiner

*Primary Examiner*—James J. Seidleck
*Assistant Examiner*—Sanza L. McClendon
(74) *Attorney, Agent, or Firm*—Townsend & Banta

(57) ABSTRACT

A photocurable composition which can be produced and cured while utilizing two different polymerization modes, can be used for bonding over a sufficiently long time period, and has excellent peel strength.

The composition comprises (A) a compound containing a polymerizable unsaturated bond and giving a homopolymer having a glass transition temperature of 0 to 100° C., (B) a compound which has an unsaturated bond and is copolymerizable with the compound (A), (C) a compound having at least one cationically polymerizable group per molecule, (D) a polymerization catalyst which upon irradiation with light initiates the polymerization of the compounds (A) and (B), and (E) a cationic polymerization catalyst which upon irradiation with light initiates the cationic polymerization of the compound (C) at the cationically polymerizable group(s).

13 Claims, No Drawings

PHOTOCURABLE COMPOSITION, PROCESS FOR PRODUCING PHOTOCURABLE COMPOSITION, PHOTOCURABLE PRESSURE-SENSITIVE ADHESIVE SHEET, PROCESS FOR PRODUCING PHOTOCURABLE PRESSURE-SENSITIVE ADHESIVE SHEET, AND METHOD OF BONDING

TECHNICAL FIELD

The present invention relates to a photocurable composition, a photocurable pressure-sensitive adhesive sheet utilizing the photocurable composition, processes for producing the photocurable composition and the photocurable pressure-sensitive adhesive sheet, and a joining method utilizing these. More particularly, the present invention relates to a photocurable composition which utilizes two different polymerization modes, i.e., can be polymerized via one polymerization mode and cured via another polymerization mode, and also to a process for producing the photocurable composition, a photocurable pressure-sensitive adhesive sheet using the photocurable composition, which exhibits a pressure-sensitive adhesive property at ordinary temperature and can be cured by irradiation. The present invention relates further to a process for producing the photocurable pressure-sensitive adhesive sheet and to a joining method.

BACKGROUND ART

Conventionally, so-called curable pressure-sensitive adhesives have been proposed which provide operating simplicity unique to pressure-sensitive adhesives, ensure safety due to exclusion of volatiles, and exhibit bond strength and film strength comparable to those of adhesives.

For example, Japanese Patent Laying-Open No. Hei 2-272076 discloses a curable pressure-sensitive adhesive tape using a heat-curable pressure-sensitive adhesive comprised of a photopolymerizable composition containing an acrylate monomer and an epoxy resin. According to this reference, the photopolymerizable composition is first treated to allow the acrylate monomer alone to undergo polymerization to provide a pressure-sensitive adhesive tape. The reference describes that adherends are combined together using this pressure-sensitive adhesive tape and then heating is applied to cure the epoxy resin so that the sufficient bond strength is obtained.

However, in the method disclosed in Japanese Patent Laying-Open No. Hei 2-272076, heat is utilized to cure the epoxy resin and develop the bond strength. This prevents application of this method to adherends made of plastics or other materials which are poor in heat resistance, thereby limiting the material types of the adherends to be combined.

Japanese Patent Kohyo No. 5-506465 discloses a pressure-sensitive adhesive containing a free-radically photopolymerizable component such as an acrylate monomer, a cationically photopolymerizable component such as an epoxy compound, and an organometallic complex salt initiator. This pressure-sensitive adhesive has been proposed to improve adhesive strength. In the production of the pressure-sensitive adhesive, irradiation is carried out to polymerize both of the aforementioned free-radically photopolymerizable component and cationically photopolymerizable component. That is, the pressure-sensitive adhesive results from the simultaneous inducement of the free-radical polymerization and cationic polymerization.

This pressure-sensitive adhesive is thus tailored such that those polymerization reactions complete while it is shaped, for example, into a sheet to impart sufficient sheet strength thereto. Although the pressure-sensitive adhesive exhibits excellent adhesive strength when joining adherends, no further improvement in bond strength thereof is expected from additional application of energy such as in the form of heat or light.

On the other hand, epoxy adhesives have achieved wide use in combining various members because they have the ability to bond a wide range of materials including metals, plastics and glasses and, when cured, exhibit improved resistance to creep, light, water, heat and chemical attack, as well as increased bond strength ("New Epoxy Resin", edited and written by Hiroshi Kakiuchi, Shoko-do, published in 1985).

However, such epoxy resin adhesives are generally used in the liquid form. This usage has sometimes led to uneven coating of epoxy resin adhesives or bleeding of adhesives if applied excessively, which provides poor appearance at a joint edge. The liquid form of the epoxy resin adhesives has also made it difficult to recoat it on the once applied surface. Further, they are generally supplied in two parts, a base resin and a curing agent. This limits a mixing ratio thereof and the occasional deviation therefrom has caused adhesive defect.

To solve the above-described problems, an epoxy resin adhesive having a shaped sheet or film form has been proposed (Japanese Patent Laying-Open No. Sho 60-173076). However, such a sheet-form epoxy adhesive exhibits a high degree of elastic modulus at ordinary state and a low degree of initial adhesion and thus lacks a temporary holding capability. This lowers workablility during a joining operation, which has been a problem. Also because the sheet-form epoxy adhesive shows insufficient adhesion to adherends, severe curing conditions such as with a high-temperature or high-pressure press are required to combine the adherends. This has made it inapplicable to adherends which have the inability to endure under such curing conditions.

The inventor of this application and others have previously proposed a photopolymerizable composition utilizing two different polymerization modes (Japanese Patent Laying-Open No. Hei 9-279103). That is, a photopolymerizable composition has been proposed which contains a free-radically polymerizable monomer such as an acrylic monomer, a free-radical polymerization catalyst, an epoxy-containing compound, and a cationic polymerization catalyst that initiates curing of the epoxy-containing compound. This composition is first exposed to a radiation to activate the free-radical polymerization catalyst. The subsequent polymerization of the free-radically polymerizable monomer results in the production of a tackifying polymer. The resultant is then shaped into a sheet. In use, this sheet is exposed to a radiation that activates the cationic polymerization catalyst. The subsequent curing of the epoxy resin results in obtaining sufficient bond strength.

However, if the curing of the epoxy resin is to be achieved, the sheet must be aged for a long period of time after exposure to a radiation. This has been a problem.

Also, the inventor of this application and others have previously proposed a curable pressure-sensitive adhesive by which adherends can be combined with each other under the curing conditions that little limit the types of the adherends used (Japanese Patent Laying-Open No. Hei 10-120988). In this reference, a curable pressure-sensitive adhesive sheet is disclosed which contains an acrylic polymer, an epoxy resin and a cationic photoinitiator. When this curable pressure-sensitive adhesive sheet is exposed to a radiation, the cationic photoinitiator is activated to initiate curing of the epoxy resin. Adherends can be joined firmly to each other simply by irradiating the curable pressure-sensitive adhesive sheet either before or after it is applied to the adherend. The heat resistance of the adherends used does not matter here.

The inventor of this application and others have also found that the curing reaction is caused to proceed as soon as the curable pressure-sensitive adhesive sheet is exposed to a radiation, its elastic modulus starts to rise after a while, and its bond strength arrives at a sufficient level after about 24 hours at room temperature.

Bond strength evaluation revealed the sufficiently increased shear strength but the occasional occurrence of insufficient peel strength.

In view of the current state of the art as described above, the present invention is directed to provide a photocurable composition which utilizes two polymerization modes, can be cured utilizing one of the polymerization modes, imposes little limitation on the type of the adherend used, has a long work life, and when cured exhibits improved bond strength, particularly in peel strength.

It is another object of the present invention to provide a photocurable pressure-sensitive adhesive sheet which is made by sheeting the aforementioned photocurable composition and when cured exhibits improved bond strength, particularly in peel strength and also provide a joining method using the sheet.

It is still another object of the present invention to provide processes for production of the aforementioned photocurable composition and photocurable pressure-sensitive adhesive sheet.

DISCLOSURE OF THE INVENTION

The invention as recited in claim 1 is a photocurable composition characterized as containing (A) a compound which has a polymerizable unsaturated bond and gives a homopolymer having a glass transition point within the range of 0–100° C., (B) a compound which has an unsaturated bond and is copolymerizable with the compound (A), (C) a compound having at least one cationically polymerizable group per molecule, (D) a polymerization catalyst which initiates polymerization of the compounds (A) and (B) upon exposure to a radiation, and (E) a cationic polymerization catalyst which initiates cationic polymerization of the cationically polymerizable group in the compound (C) upon exposure to a radiation.

In the invention as recited in claim 2, a compound (B1) having at least one (meth)acryloyl group and at least one hydroxyl group in a molecule and a compound (B2) having an unsaturated bond that is copolymerizable with the compound (B1) are used in combination to constitute the compound (B).

In the invention as recited in claim 3, the cationically polymerizable group in the compound (C) is specified as an epoxy group. Accordingly, an epoxy-containing compound is used as the compound (C).

In the invention as recited in claim 4, the above-described polymerization catalyst (D) is specified as one which is activated upon exposure to a radiation including a wavelength of 370–800 nm to initiate polymerization of the compounds (A) and (B). The cationic polymerization catalyst (E) is specified as one which is activated upon exposure to a radiation including a wavelength of not below 300 nm but below 370 nm to initiate polymerization of the cationically polymerizable group in the compound (C).

The invention as recited in claim 5 is a photocurable composition characterized as containing (A3) a copolymer of the compounds (A) and (B) as recited in claim 1, (C) a compound having at least one cationically polymerizable group in a molecule, and (E) a cationic polymerization catalyst which initiates cationic polymerization of the cationically polymerizable group in the compound (C) upon exposure to a radiation.

The invention as recited in claim 6 is a process for producing a photocurable composition characterized in that the photocurable composition as recited in any one of claims 1–4 is exposed to a radiation that activates the polymerization catalyst (D) alone to initiate polymerization of the compounds (A) and (B) so that the copolymer (A3) of the compounds (A) and (B) is obtained.

The invention as recited in claim 7 is a photocurable pressure-sensitive adhesive sheet characterized as being made by sheeting the photocurable composition as recited in claim 5.

The invention as recited in claim 8 is a process for producing a photocurable pressure-sensitive adhesive sheet characterized as comprising, in sequence, applying the photocurable composition as recited in any one of claims 1–4 and exposing the applied photocurable composition to a radiation that activates the polymerization catalyst (D) alone to initiate polymerization of the compounds (A) and (B) so that the copolymer (A3) of the compounds (A) and (B) is obtained.

The invention as recited in claim 9 is a joining method characterized as comprising exposing the photocurable pressure-sensitive adhesive sheet as recited in claim 7, either before or after application to an adherend, to a radiation with a wavelength of not below 300 nm but below 370 nm to thereby activate the compound (E), and then combining the adherend with another adherend.

The present invention is below described in detail.

In the present invention, the compound (A) which has a polymerizable unsaturated bond and gives a homopolymer having a glass transition temperature within the range of 0–100° C. is not particularly specified in type, so long as it satisfies the specified conditions. The homopolymer, as used herein, refers to a homopolymer with a number average molecular weight of 10,000 or higher. The glass transition temperature (Tg), as used in this specification, refers to a value either determined by a differential scanning calorimeter (DSC) or given in Polymer Handbook (Third Edition, Wiley Interscience).

Examples of compounds (A) include methyl acrylate (a glass transition temperature of its homopolymer (a glass transition temperature of a homopolymer is hereinafter abbreviated as Tg)=10° C.), tert-butyl acrylate (Tg=41° C.), neopentyl acrylate (Tg=22° C.), lauryl acrylate (Tg=15° C.), cetyl acrylate (Tg=35° C.), cyclohexyl acrylate (Tg=15° C.), isobornyl acrylate (Tg=94° C.), phenyl acrylate (Tg=57° C.), benzyl acrylate (Tg=6° C.), o-toluyl acrylate (Tg=25° C.), m-toluyl acrylate (Tg=52° C.), p-toluyl acrylate (Tg=43° C.), 2-naphthyl acrylate (Tg=85° C.), 4-butoxycarbonylphenyl acrylate (Tg=13° C.), 2-methoxycarbonylphenyl acrylate (Tg=46° C.), 2-acryloyloxyethyl-2-hydroxypropyl phthalate (Tg=68° C.), 2-hydroxy-3-phenoxy-propyl acrylate (Tg=17° C.), ethyl methacrylate (Tg=65° C.), n-butyl methacrylate (Tg=20° C.), sec-butyl methacrylate (Tg=60° C.), isobutyl methacrylate (Tg=48°

C.), propyl methacrylate (Tg=35° C.), isopropyl methacrylate (Tg=81° C.), n-stearyl methacrylate (Tg=38° C.), cyclohexyl methacrylate (Tg=66° C.), 4-tert-butylcyclohexyl methacrylate (Tg=83° C.), tetrahydrofurfuryl methacrylate (Tg=60° C.), benzyl methacrylate (Tg=54° C.), phenethyl methacrylate (Tg=26° C.), 2-hydoxyethyl methacrylate (Tg=55° C.), 2-hydroxypropyl methacrylate (Tg=26° C.), glycidyl methacrylate (Tg=46° C.) and the like. The above-listed compounds (A) may be used alone or in combination.

When exposed to a radiation, the polymerization catalyst (D) is activated so that the above-described compounds (A) and (B) are copolymerized into the copolymer (A3) as recited in claim 5.

Any compound can be used as the compound (B), so long as it has an unsaturated bond copolymerizable with the compound (A). Examples of compounds (B) include styrene derivatives, vinyl ester derivatives, N-vinyl derivatives, (meth)acrylate derivatives, (meth)acrylonitrile derivatives, (meth)acrylic acid, maleic anhydride, maleimide derivatives and the like. The above-listed compounds (B) may also be used alone or in combination.

Examples of styrene derivatives include styrene, indene, p-methyl styrene, α-methyl styrene, p-methoxy styrene, p-tert-butoxy styrene, p-chloromethyl styrene, p-acetoxy styrene, divinyl benzene and the like.

Examples of vinyl ester derivatives include vinyl acetate, vinyl propionate, vinyl butyrate, vinyl caproate, vinyl cinnamate and the like.

Examples of N-vinyl derivatives include N-vinylpyrrolidone, N-acryloylmorpholine, N-vinylcaprolactone, N-vinylpiperidine and the like.

Examples of useful (meth)acrylate derivatives include methyl (meth)acrylate, ethyl (meth)acrylate, propyl (meth)acrylate, n-butyl (meth)acrylate, tert-butyl (meth) acrylate, cyclohexyl (meth)acrylate, 2-ethylhexyl (meth)acrylate, n-octyl (meth)acrylate, isooctyl (meth)acrylate, isononyl (meth)acrylate, isomyristyl (meth)acrylate, stearyl (meth)acrylate, isobornyl (meth)acrylate, benzyl (meth)acrylate, 2-butoxyethyl (meth)acrylate, 2-phenoxyethyl (meth) acrylate, glycidyl (meth) acrylate, tetrahydrofurfuryl (meth) acrylate, hexanediol di(meth)acrylate, ethylene glycol di (meth)acrylate, polyethylene glycol di (meth) acrylate, propylene glycol di(meth)acrylate, polypropylene glycol di(meth)acrylate, neopentyl glycol di (meth)acrylate, trimethylolpropane tri (meth) acrylate, pentaerythritol di (meth) acrylate, pentaerythritol tri (meth) acrylate, pentaerythritol tetra (meth) acrylate, dipentaerythritol hexa(meth)acrylate, epoxy acrylate, polyester acylate, urethane acrylate, (Compound 1)
$CH_2=CH-C(O)O-(CH_2CH_2O)n-CH_3$ (n=1–10),
(Compound 2)
$CH_2=C(CH_3)-C(O)O-(CH_2CH_2O)n-CH_3$ (n=1–30),
(Compound 3)
$CH_2=CH-C(O)O-[CH_2CH(CH_3)O]n-CH_3$ (n=1–10),
(Compound 4)
$CH_2=C(CH_3)-C(O)O-[CH_2CH(CH_3)O]n-CH_3$ (n=1–10),
(Compound 5)
$CH_2=C(CH_3)-C(O)O-(CH_2CH_2O)n-[CH_2CH(CH_3)O]m-CH_3$ (n=1–10, m=1–10), and
(Compound 6)
$CH_2=CH-C(O)O-(CH_2CH_2O)n-[CH_2CH(CH_3)O]m-CH_3$ (n=1–10, m=1–10).

Preferably, the compound (B) comprises a combination of the compound (B1) having at least one (meth)acryloyl group and at least one hydroxyl group in a molecule and the compound (B2) having an unsaturated bond and copolymerizable with the compound (B1), as recited in claim 2. This enables faster completion of curing.

The compound (B1) having at least one (meth)acryloyl group and at least one hydroxyl group in a molecule is not particularly specified in type. Examples thereof include 2-hydroxyethyl (meth)acrylate, 3-hydroxypropyl (meth)acrylate, 2-hydroxypropyl (meth)acrylate, 4-hydroxybutyl (meth)acrylate, 2-hydroxybutyl (meth)acrylate, 5-hydroxypentyl (meth)acrylate, 6-hydroxyhexyl (meth)acrylate, 3-hydroxy-3-methylbutyl (meth) acrylate, 2-hydroxy-3-phenoxypropyl (meth)acrylate, pentaerythritol tri(meth)acrylate, 2-[(meth)acryloyloxy]ethyl 2-hyroxyethyl phthalate, 2-[(meth)acryloyloxy]ethyl 2-hydroxypropyl phthalate, (Compound 7)
$CH_2=CH-C(O)O-CH_2CH_2O-[C(O)CH_2CH_2CH_2CH_2CH_2O]n-H$ (n=1–10),
(Compound 8)
$CH_2=C(CH_3)-C(O)O-CH_2CH_2O-[C(O)CH_2CH_2CH_2CH_2CH_2O]n-H$ (n=1–10),
(Compound 9)
$CH_2=CH-C(O)O-(CH_2CH_2O)n-H$ (n=1–12),
(Compound 10)
$CH_2=C(CH_3)-C(O)O-(CH_2CH_2O)n-H$ (n=1–12),
(Compound 11)
$CH_2=CH-C(O)O-[CH_2CH(CH_3)O]n-H$ (n=1–12),
(Compound 12)
$CH_2=C(CH_3)-C(O)O-[CH_2CH(CH_3)O]n-H$ (n=1–12),
(Compound 13)
$CH_2=C(CH_3)-C(O)O-(CH_2CH_2O)n-[CH_2CH(CH_3)O]m-H$ (n=1–12, m=1–10),
(Compound 14)
$CH_2=CH-C(O)O-(CH_2CH_2O)n-[CH_2CH(CH_3)O]m-H$ (n=1–12, m=1–10),
(Compound 15)
$CH_2=C(CH_3)-C(O)O-(CH_2CH_2O)n-(CH_2CH_2CH_2CH_2O)m-H$ (n=1–12, m=1–10), and
(Compound 16)
$CH_2=CH-C(O)O-(CH_2CH_2O)n-(CH_2CH_2CH_2CH_2O)m-H$ (n=1–12, m=1–10).

The above-listed compounds (B1) may be used alone or in any combination thereof.

Also, the compound (B2) having an unsaturated bond and copolymerizable with the compound (B1) is not particularly specified in type and can be suitably chosen from those useful for the compound (B). Such compounds (B) may be used alone or in combination.

Where the compound (B1) and the compound (B2) are used in combination, blending proportions thereof are not particularly specified. Preferably, the compound (B2) in the amount of 1–10,000 parts by weight is mixed with 100 parts by weight of the compound (B1). If the amount of the compound (B2) is below 1 part by weight, a curing speed thereof after exposure to a radiation may become excessively fast to result occasionally in the failure to provide a sufficiently long working life. If it exceeds 10,000 parts by weight, the curing speed sometimes become slow and in some cases drops to an impracticable level.

The compound (C) having at least one cationically polymerizable group in a molecule is not particularly specified in type, so long as it has at least one cationically polymerizable group in a molecule. For example, a cationically polymerizable compound can be used which contains a cationically polymerizable group such as a vinyloxy, styryl, epoxy or oxetanyl group. A compound containing an epoxy group as the cationically polymerizable group is preferably used for its good adhesive properties and durability.

More specifically, examples of vinyloxy-containing compounds include, but not limited to, n-propyl vinyl ether, n-butyl vinyl ether, isobutyl vinyl ether, tert-butyl vinyl ether, tert-amyl vinyl ether, cyclohexyl vinyl ether, 2-ethylhexyl vinyl ether, dodecyl vinyl ether, octadecyl vinyl ether, 2-chloroethyl vinyl ether, ethylene glycol butyl vinyl ether, (4-vinyloxy)butyl benzoate, ethylene glycol divinyl ether, diethylene glycol divinyl ether, triethylene glycol divinyl ether, tetraethylene glycol divinyl ether, butane-1,4-diol-divinyl ether, hexane-1,6-diol-divinyl ether, cyclohexane-1,4-dimethanol-divinyl ether, di(4-vinyloxy) butyl isophthalate, di(4-vinyloxy)butyl glutarate, di(4-vinyloxy)butyl succinate, trimethylolpropane trivinyl ether, 2-hydroxyethyl vinyl ether, 4-hydroxybutyl vinyl ether, 6-hydroxyhexyl vinyl ether, cyclohexane-1,4-dimethanol-monovinyl ether, diethylene glycol monovinyl ether, 3-aminopropyl vinyl ether, 2-(N,N-diethylamino)ethyl vinyl ether, urethane vinyl ether, polyester vinyl ether and the like.

Examples of styryl-containing compounds include, but not limited to, styrene, p-methylstyrene, α-methylstyrene, p-methoxystyrene, p-tert-butoxystyrene, p-chloromethylstyrene, p-acetoxystyrene, divinyl benzene and the like.

Examples of epoxy-containing compounds include, but not limited to, bisphenol A epoxy resins, hydrogenated bisphenol A epoxy resins, bisphenol F epoxy resins, novolac epoxy resins, alicyclic epoxy resins, brominated epoxy resins, rubber modified epoxy resins, urethane modified epoxy resins, glycidyl ester compounds, epoxidated polybutadiene, epoxidated SBS (SBS represents a styrene-butadiene-styrene copolymer), and the like. The above-listed epoxy compounds after cure can develop high adhesion and durability.

The above-listed compounds (C) having at least one cationically polymerizable group in a molecule may be used alone or in any combination. A compound having different types of cationically polymerizable groups in a molecule may also be used.

The polymerization catalyst (D) is activated upon exposure to a radiation to initiate polymerization of the compound (A) and the compound (B). The polymerization catalyst (D) is not particularly specified in type, so long as it can initiate polymerization of the compound (A) and the compound (B). A free-radical photopolymerization catalyst or the like can be used.

Examples of free-radical photopolymerization catalysts useful for the polymerization catalyst (D) include acetophenone derivative compounds such as 4-(2-hydroxy-ethoxy) phenyl(2-hydroxy-2-propyl)ketone, α-hydroxy-α,α'-dimethylacetophenone, methoxyacetophenone and 2,2-dimethoxy-2-phenylacetophenone; benzoin ether compounds such as benzoin ethyl ether and benzoin propyl ether; ketal derivative compounds such as benzylmethylketal; halogenated ketone; acylphosphine oxide; acylphosphonate; 2-methyl-1-[4-(methylthio)phenyl]-2-morpholinopropane-1-one; 2-benzyl-2-N,N-dimethylamino-1-(4-morpholinophenyl)-1-butanone; 2,4,6-trimethylbenzoyl-diphenylphosphine oxide; bis-(2,6-dimethoxybenzoyl)-2,4,4-trimethylpentylphosphine oxide; bis (n5-cyclopentadienyl)-bis(pentafluorophenyl)-titanium; bis (n5-cyclopentadienyl)-bis [2, 6-difluoro-3-(1H-pyri-1-yl)phenyl]-titanium; and the like.

The above-listed polymerization catalysts (D) may be used alone or in any combination.

Preferably, the polymerization catalyst (D) does not increase a response of the cationic polymerization catalyst (E) to a radiation.

In the present invention, the cationic polymerization catalyst (E), responsive to irradiation, for initiating cationic polymerization and thus curing of the compound (C) is not particularly specified, so long as it when irradiated can initiate polymerization of the comound (C) Cationic photopolymerization catalysts known in the art and the like can be used.

Although not considered to be limiting, the cationic photopolymerization catalyst is selected from iron-arene complex compounds, aromatic diazonium salts, aromatic iodonium salts, aromatic sulfonium salts, pyridinium salts and aluminum complex/silyl ether, for example. Such cationic photopolymerization catalysts may be used alone or in any combination.

Specific Examples of cationic photopolymerization catalysts include those sold in the market, such as IRGACURE 261 (product of Ciba Geigy Corp.), OPTOMER SP-150 (product of Asahi Denka Kogyo Co., Ltd.), OPTOMER SP-151 (product of Asahi Denka Kogyo Co., Ltd.), OPTOMER SP-170 (product of Asahi Denka Kogyo Co., Ltd.), OPTOMER SP-171 (product of Asahi Denka Kogyo Co., Ltd.), UVE-1014 (product of General Electric Co.), CD-1012 (product of Sartomer Company, Inc.), SANAID SI-100L (product of Sanshin Chem. Industry Co., Ltd.), CI-2064 (product of Nippon Soda Co., Ltd.), CI-2639 (product of Nippon Soda Co., Ltd.), CI-2624 (product of Nippon Soda Co., Ltd.), CI-2481 (product of Nippon Soda Co., Ltd.), RHODORSIL Photoinitiator 2074 (product of Rhone Poulenc GmbH), UVI-6990 (product of Union Carbide Corp.), BBI-103 (product of Midori Kagaku Co., Ltd.), MPI-103 (product of Midori Kagaku Co., Ltd.), TPS-103 (product of Midori Kagaku Co., Ltd.), MDS-103 (product of Midori Kagaku Co., Ltd.), DTS-103 (product of Midori Kagaku Co., Ltd.), NAT-103 (product of Midori Kagaku Co., Ltd.) and NDS-103 (product of Midori Kagaku Co., Ltd.).

In the photocurable composition in accordance with the invention as recited in claim 1, polymerization of the compounds (A) and (B) and polymerization of the compound (C) may be effected separately. In such a case, it is preferred to use a combination of the free-radical polymerization catalyst (D) that is activated upon exposure to a radiation including a wavelength of 370–800 nm and the cationic photopolymerization catalyst (E) that is activated upon exposure to a radiation including a wavelength of 300-below 370 nm. This reduces an internal stress produced during polymerization or curing to a minmum level.

That is, a higher radiation energy is required to activate the cationic photopolymerization catalyst (E) than activating the free-radical polymerization catalyst (D). It is accordingly preferred that the respective photosensitive wavelengths of the cationic photopolymerization catalyst (E) and the free-radical photopolymerization catalyst (D) are adjusted to fall within the above-specified ranges. If the free-radical polymerization catalyst (D) is sensitive only to a radiation that includes a wavelength of below 370 nm, it becomes difficult to activate, by irradiation, the free-radical polymerization catalyst (D) alone. On the other hand, if the cationic photopolymerization catalyst (E) is sensitive only to a radiation including a wavelength that exceeds 800 nm, irradiation sometimes becomes practically difficult to provide a sufficinet energy to increase a cure rate to a satisfactory level, although it is able to allow a polymerization or curing reaction to go proceed.

Also, if the cationic photopolymerization catalyst (E) is sensitive only to a radiation that includes a wavelength of below 300 nm, it becomes possible for the radiation to provide a sufficient energy. However, polymerization or curing occurs predominantly at a surface portion of the photocurable composition. Particularly when the composition is thick applied, it sometimes becomes difficult to cause uniform curing of an epoxy compound in a region from the irradiated surface to a deep portion of the photocurable composition. If the cationic photopolymerization catalyst (E) is sensitive only to a radiation including a wavelength of 370 nm or above, irradiation sometimes becomes difficult to provide a sufficinet energy to increase a cure rate to a satisfactory level, although it is able to allow a curing reaction of an epoxy compound to proceed uniformly.

(Blending Proportion)

A blending proportion of components in the photocurable composition in accordance with the invention as recited in claim 1 is not particularly specified. Preferably, the photocurable composition contains 100 parts by weight of compound (A), 1–10,000 parts by weight of compound (B), 1–10,000 parts by weight of compound (C), 0.001–1,000 parts by weight of the polymerization catalyst (D) and 0.001–1,000 parts by weight of cationic photopolymerization catalyst (E).

If the amount of the compound (B) incorporated in the composition is below 1 part by weight, the expected fast-curing effect of the compound (B) may not be obtained. If it exceeds 10,000 parts by weight, the compound (A) becomes lower in content to occasionally result in the failure to obtain the expected peel strength improving effect of the compound (A). If the amount of the compound (C) is below 1 part by weight, the compound (C) becomes lower in content to result sometimes in the failure to obtain the expected adhesion improving effect thereof. If it exceeds 10,000 parts by weight, the compound (A) becomes relatively lower in content to occasionally result in the failure to obtain the expected peel strength improving effect of the compound (A).

If the amount of the polymerization catalyst (D) incorporated in the composition is below 0.001 parts by weight, the active species generated by irradiation becomes lower in concentration to result sometimes in the difficulty to obtain a sufficient polymerization rate. On the other hand, if it exceeds 1,000 parts by weight, the concentration of active species generated by irradiation in some cases becomes excessively high to result in the difficulty to control a polymerization rate.

If the amount of the cationic photopolymerization catalyst (E) incorporated in the composition is below 0.001 parts by weight, the active species generated by irradiation becomes lower in concentration to result sometimes in the difficulty to obtain a sufficient polymerization rate. On the other hand, if it exceeds 1,000 parts by weight, the concentration of active species generated by irradiation in some cases becomes excessively high to result in the difficulty to control a polymerization rate.

In the invention as recited in claim 5, the copolymer (A3) is contained which is obtained via copolymerization of the compounds (A) and (B) for use in the photocurable composition in accordance with the invention as recited in claim 1. Accordingly, the polymerization catalyst (D) is excluded.

If stated differently, the photocurable composition in accordance with the invention as recited in claim 5 contains the compound (A3) obtained, for example, by exposing the photocurable composition in accordance with the invention as recited in claim 1 to a radiation so that the polymerization catalyst (D) is activated to initiate polymerization of the compound (A) and (B).

The compound (C) and the cationic photopolymerization catalyst (E) in the photocurable composition in accordance with the invention as recited in claim 5 are similar in types to those for use in the invention as recited in claim 1. Accordingly, their details are omitted here by refering to the preceding descriptions.

The copolymer (A3) is not particularly specified in structure and may be in the form of a general homopolymer, random copolymer, block copolymer, alternating copolymer, stereoregular (co)polymer, multibranched (co)polymer, star (co)polymer, tree-like (co)polymer, ladder (co)polymer, cyclic (co)polymer, helix (co)polymer or the like. The term (co)polymer is generically used herein to encompass both a homopolymer and a copolymer.

Although not particularly specified, the copolymer (A3) preferably has a large weight average molecular weight, preferably in the approximate range of 200,000–5,000,000. If its weight average molecular weight is less than 200,000, the composition when sheeted shows insufficient cohesion and when applied shows webbing which increases the tendency thereof to delaminate. If greater than 5,000,000, the composition containing the copolymer (A3) and the compound (C) increases its viscosity to sometimes result in the difficulty to render it into a sheet form.

In the invention as recited in claim 5, the cationic photopolymerization catalyst (E) and the copolymer (A3) are incorporated preferably in the respective ranges of 0.001–1,000 parts by weight and 1–10,000 parts by weight, based on 100 parts by weight of the compound (C), for the same reason as applied to the inventions as recited in claims 1–4.

If the amount of the copolymer (A3) is less than 1 part by weight, the initial cohesion and tack improvements as expected from the presence of the copolymer (A3) may not be obtained. If greater than 10,000 parts by weight, the compound (C) decreases in content. In some cases, this results in the failure to obtain the adhesion improving effect of the compound (C) as expected.

Preferably, the photocurable composition in accordance with the invention as recited in claim 5 is obtained by the practice of the production method as recited in claim 6, i.e., by exposing the photocurable composition in accordance with the invention as recited in any one of claims 1–4 to a radiation so that the polymerization catalyst (D) is activated to initiate copolymerization of the compounds (A) and (B). The use of this method is favored since it can eliminate a step of mixing the compound (C), the cationic photopolymerization catalyst (E) and the, copolymer (A3).

A radiation source used to activate the polymerization catalyst (D) has an emitting radiation in the 370–800 nm wavelength region. Useful sources of radiation include a low-pressure mercury lamp, a medium-pressure mercury lamp, a high-pressure mercury lamp, an ultra high-pressure mercury lamp, chemical lamps, black light lamps, microwave-excited mercury lamps, metal halide lamps and fluorescent lamps, for example. In this case, a radiation source may be adjusted to emit radiation that excludes wavelengths of below 370 nm so that the cationic polymerization catalyst (E) is left unreacted.

(Photocurable Pressure-sensitive Adhesive Sheet)

The photocurable composition in accordance with the invention as recited in claim 5, when rendered into a sheet form, provides a photocurable pressure-sensitive adhesive sheet. Such a photocurable pressure-sensitive adhesive sheet is a favored form since it facilitates weight control and thickness adjustment of a coating of the photocurable composition during a joint operation.

The technique used to render the composition into a sheet form is not particularly specified. Hot-melt coating, cast coating or other suitable known techniques can be used to render the photocurable composition as recited in claim 5 into a sheet form. Preferably, a method is utilized which includes applying, in the form of a film, the photocurable composition in accordance with the invention as recited in any one of claims 1–4, exposing the sheet to a radiation that activates only the free-radical polymerization catalyst (D) and effecting copolymerization of the compounds (A) and (B). This method advantageously simplifies a manufacturing process.

(Joining Method)

When the photocurable pressure-sensitive adhesive sheet in accordance with the present invention is utilized to join adherends to each other, the photocurable pressure-sensitive adhesive sheet either before or after its application to an adherent is exposed to a radiation to activate the cationic photopolymerization catalyst (E) and then the adherends are combined together. Also, the cationic photopolymerization catalyst (E) is preferably exposed to a radiation with a wavelength of 300-below 370 nm and at an energy intensity of at least 50 mJ/cm$^2$. If the energy intensity is below 50 mJ/cm$^2$, the exposure in some cases results in the difficulty to activate the cationic photopolymerization catalyst (E) to a sufficient degree.

Examples of sources of radiation which activates the photocurable composition in accordance with the present invention include an excimer laser, a low-pressure mercury lamp, a medium-pressure mercury lamp, a high-perssure mercury lamp, an ultra high-pressure mercury lamp, chemical lamps, blacklight lamps, microwave-excited mercury lamps, metal halide lamps, fluorescent lamps, and natural light such as sunlight. A suitable filter may also be,used to selectively provide a radiation in a desirable wavelength region, for the purpose of activating the compounds (D) and (E) in an independent fashion.

(Other Applicable Components)

Besides the above-specified essential components, the photocurable composition and photocurable pressure-sensitive adhesive sheet in accordance with the present invention may further contain a tackifier, extender, sensitizer or other additive known in the art, if appropriate, within the range that does not impede the purposes of the present invention.

Examples of applicable tackifiers include a rosin resin, modified rosin resin, terpene resin, terpene phenol resin, aromatic modified terpene resin, C5 or C9 petroleum resin, coumarone resin and the like. Particularly in the case of polyolefin adherends, the use of rosin and petroleum resins is preferred for their ability to build strong bond strength.

Also, a thickening agent such as acrylic rubber, epichlorohydrin rubber or butyl rubber; a thixotropic agent such as colloidal silica or polyvinyl pyrrolidone; an extender such as calcium carbonate, titanium oxide or clay; or an adjusting agent such as polyester, (meth)acrylic polymer, polyurethane, silicone, polyether, polyvinyl ether, polyvinyl chloride, polyvinyl acetate, polyisobutylene or wax may be added to improve spreadability.

Also, in the case where the photocurable composition in accordance with the present invention is utilized as an adhesive, inorganic hollow particles such as glass balloons, alumina balloons and ceramic balloons; organic spheres such as nylon beads, acrylic beads and silicone beads; organic hollow particles such as vinylidene chloride balloons and acrylic balloons; or single fibers such as of glass, polyester, rayon, nylon, cellulose or acetate may be added to realize improved shear bond strength.

In the case where the glass fibers are incorporated, they can be added in the form of fibrous chips to the composition. However, the improved shear bond strength can be obtained if the photocurable composition is impregnated into a woven glass fiber and subjected to polymerization.

For the purpose of increasing the radiation sensitivity, a photosensitizer may be suitably added. Examples of photosensitizers include anthracene, perylene, coronene, tetracene, benzanthracene, phenothiazine, flavin, acridine, keto-coumarin, derivatives of thioxanthone, benzophenone, acetophenone, 2-chlorothioxanthone, 2,4-dimethylthioxanthone, 2,4-diethylthioxanthone, 2,4-diisopropylthioxanthone, isopropylthioxanthone and the like.

Also for the purpose of adjusting a period of time the composition remains workable after it has been irradiated, i.e., a working life, a compound having a cyclic ether structure or polyether may be suitably incorporated. Examples of compounds having a cyclic ether structure include 12-crown-4, 15-crown-5, 18-crown-6, 24-crown-8, 30-crown-10, 2-aminomethyl-12-crown-4, 2-aminomethyl-15-crown-5, 2-aminomethyl-18-crown-6, 2-hydroxymethyl-12-crown-4, 2-hydroxymethyl-15-crown-5, 2-hydroxymethyl-18-crown-6,25 dicyclohexano-18-crown-6, dicyclohexano-24-crown-8, dibenzo-18-crown-6, dibenzo-24-crown-8, dibenzo-30-crown-10, benzo-12-crown-4, benzo-15-crown-5, benzo-18-crown-6, 4'-aminobenzo-15-crown-5, 4'-bromobenzo-15-crown-5, 4'-formylbenzo-15-crown-5, 4'-nitrobenzo-15-crown-5, bis [(benzo-15-crown-5)-15-ylmethyl]pimelate, poly [(dibenzo-18-crown-6)-co-formaldehyde] and the like. Examples of polyethers include polyethylene glycol, polypropylene glycol, polytetrahydrofuran and the like.

(Processed Articles Utilizing a Photocurable Pressure-sensitive Adhesive Sheet)

The photocurable pressure-sensitive adhesive sheet in accordance with the present invention can be rendered into a pressure-sensitive adhesive article by placing it onto at least one surface or portion of a substrate. That is, the photocurable pressure-sensitive adhesive sheet in accordance with the present invention may or may not have a substrate. In the latter case, it may constitute a pressure-sensitive adhesive layer placed on at least one surface or portion of the substrate.

Examples of useful substrates include, but not limited to, nonwoven fabrics made of rayon, cellulose and others; films or sheets made of polyethylene, polyester, poly-styrene, cellophane, polypropylene, polyimide and other synthetic resins; foams such as polyethylene foam, urethane foam and vinyl chloride foam; synthetic resin plates made of synthetic resins such as polyethylene, polyester, poly-styrene, acryl, ABS, polypropylene, rigid vinyl chloride and polycarbonate, and sheets or plates made of metals such as steel, stainless steel, aluminum, copper and plated steel. Other useful substrates include glass, ceramics, wood, paper and fabrics. The substrate is not limited in shape to a sheet, plate or other flat thin form, and may have any aribitrary shape such as a prismatic or rod form. It may include a nonspherical surface.

(Action)

In the photocurable composition in accordance with the invention as recited in claim 1, the polymerization catalyst (D) is activated by irradiation to initiate polymerization of the compounds (A) and (B), resulting in the production of the copolymer (A3). The emergence of pressure-sensitive adhesive property attributed to the copolymer (A3) makes the composition readily applicable to an adherend. Also, exposure of the composition to a radiation that activates the cationic photopolymerization catalyst (E) intiates cationic polymerization of the cationically polymerizable groups in the compound (C), which leads to polymerization and curing of the composition.

That is, the photocurable composition in accordance with the present invention is a radiation polymerizable composition which can take advantage of two different polymerization modes. The composition is rendered readily applicable to an adherend by the pressure-sensitive adhesive property that is controlled by the copolymer (A3). Also, polymerization of the compound (C) results in a cured product which provides strong adhesion.

In particular, the photocurable composition comes to contain the copolymer (A3) of the compound (A) which has a polymerizable unsaturated bond and gives a homopolymer having a glass transition point within the range of 0–100° C. and the compound (B) having an unsaturated bond and copolymerizable with the compound (A), and also contain the compound (C) having at least one cationically polymerizable group in a molecule and curable via cationic polymerization. This enables effective increase in peel adhesion of the composition, as apparent from the below-described Examples.

In the invention as recited in claim 2, a compound (B1) having at least one (meth)acryloyl group and at least one hydroxyl group in a molecule and a compound (B2) having an unsaturated bond and copolymerizable with the compound (B1) are used in combination to serve as the compound (B). Due to the copolymer (A3) derived therefrom, the composition exhibits improved pressure-sensitive adhesive properties.

In the invention as recited in claim 3, the cationically polymerizable group in the compound (C) is specified as an epoxy group. The cationic polymerization thus occurs in the form of ring-opening polymerization of the epoxy groups, resulting in obtaining a cured product which provides further improved bond strength, particularly peel strength.

In the invention as recited in claim 4, since the polymerization catalyst (D) initiates polymerization of the compounds (A) and (B) upon exposure to a radiation that includes a wavelength of 370–800 nm and the cationic polymerization catalyst (E) initiates polymerization of the cationically polymerizable groups in the compound (C) upon exposure to a radiation that includes a wavelength of not below 370 nm but below 370 nm, the composition is designed to polymerize in two different modes by irradiation at differing wavelengths. Accordingly, activation of the cationic polymerization catalyst (E) hardly occurs in the process where the copolymer (A3) is obtained through polymerization of the compounds (A) and (B). Utilization of these two different polymerization modes insures production of the copolymer (A3) and curing of the composition.

The photocurable composition in accordance with the invention as recited in claim 5 contains the copolymer (A3) formed via copolymerization of the compound (A) and the composition (B) for use in the photocurable composition in accordance with the invention as recited in claim 1. The compound (C) is caused to cure upon exposure to a radiation that activates the cationic polymerization catalyst (E), resulting in obtaining a cured product having improved bond strength, particularly peel strength. Also, the tackiness attributed to the copolymer (A3) makes the composition readily applicable to an adherend.

In the method for producing a photocurable composition in accordance with the invention as recited in claim 6, exposure of the photocurable composition in accordance with any one of claims 1–4 to a radiation that activates the polymerization catalyst (D) alone causes the compounds (A) and (B) to polymerize into the copolymer (A3), resulting in obtaining the photocurable composition in accordance with claim 5.

The photocurable pressure-sensitive adhesive sheet in accordance with the invention as recited in claim 7 is made by rendering the photocurable composition in accordance with the invention as recited in claim 5 into a sheet form. With this sheet form, the photocurable composition can be applied to an adherend without causing little variations in weight and thickness of its coating on the adherend.

In the process for producing a photocurable pressure-sensitive adhesive sheet in accordance with the invention as recited in claim 8, the photocurable pressure-sensitive adhesive sheet is obtained by application and subsequent exposure of the photocurable composition in accordance with the invention as recited in any one of claim 1–4 to a radiation that activates the polymerization catalyst (D) for catalyzing production of the copolymer (A3). This enables us to produce the photocurable pressure-sensitive adhesive sheet in accordance with the invention as recited in claim 7 in a simple operation, i.e., by the sequence of application and exposure.

In the joining method in accordance with the invention as recited in claim 9, the photocurable pressure-sensitive adhesive sheet, either before or after application to an adherend, is exposed to a radiation that activates the cationic polymerization catalyst for causing a curing reaction to proceed and, subsequent to the exposure, the adherend is combined with another adherend.

BEST MODE FOR CARRYING OUT THE INVENTION

The present invention is below described in more detail by referring to non-limiting examples thereof.

EXAMPLE 1

10 g of cyclohexyl acrylate (Tg of its homopolymer=15° C.) as the compound (A), 30 g of tetrahydrofurfuryl acrylate as the compound (B2), 20 g of the aforementioned compound 8 (product of Daicel Chem. Industries, Ltd., product name: PLAXEL FM-2D, the compound 8 with n=2), 30 g of the epoxy resin 1 (product of Yuka-Shell Epoxy Co., Ltd., product name: EPICOAT 828, bisphenol A epoxy resin), 20 g of the epoxy resin 2 (product of New Japan Chem. Co., Ltd., product name: RIKARESIN BEO-60E), 0.5 g of a composition containing bis (2, 6-dimethoxybenzoyl)-2,4, 4-trimethylpentylphosphine oxide (product of Ciba Geigy Corp., product name: IRGACURE 1700) which is a free-radical photopolymerization catalyst serving as the polymerization catalyst (D), and 0.5 g of OPTOMER SP-170, manufactured by Asahi Denka Co., Ltd., as the cationic photopolymerization catalyst (E) were mixed with stirring to homogeneity. The mixture was then bubbled with nitrogen for 20 minutes to remove oxygen dissolved therein, so that a photocurable composition was obtained.

The photocurable composition was applied onto a polyethylene terephthalate film having a release-treated surface to form a 0.3 mm thick coating. Another release-surfaced polyethylene terephthalate film was superimposed to cover the coating. As a result, a laminate was obtained including a photocurable composition layer interposed between the polyethylene terephthalate films.

This laminate was exposed to a near ultraviolet radiation that substantially excluded a wavelength region of 370 nm and below, at an intensity of 1 mW/cm$^2$ for 10 minutes using a fluorescent lamp having an emitting radiation with a maximum wavelength at 400 nm. This resulted in obtaining a photocurable pressure-sensitive adhesive sheet comprising a photocurable composition including the copolymer (A3), the compound (C) having a cationically polymerizable group and the cationic polymerization catalyst (E).

EXAMPLES 2–12 AND COMPARATIVE EXAMPLES 1 AND 2

The procedure of Example 1 was repeated, except that the initial formulation was changed to those shown in the below-given Table 1, to obtain photocurable compositions and further photocurable pressure-sensitive adhesive sheets.

Evaluation of Examples and Comparative Examples

The above-obtained photocurable pressure-sensitive adhesive sheets were evaluated for (1) peel strength and (2) cure completion time in accordance with the following procedures. The results are given in Table 1.

(1) Peel Strength Evaluation

Each of the photocurable pressure-sensitive adhesive sheets obtained in Examples and Comparative Examples was cut into a 25 mm×50 mm size and applied onto a stainless steel plate (SUS 304, 30 mm wide×200 mm long× 0.05 mm thick, hereinafter referred to as adherend A) previously planished, degreased at its surface with ethyl acetate and dried. The applied photocurable pressure-sensitive adhesive sheet was exposed at its surface to a radiation in the 300 nm–370 nm wavelength region at an intensity of 30 mW/cm$^2$ for a period of 30 seconds. Immediately after the irradiation, the covering polyethylene terephthalate film was removed from the photocurable pressure-sensitive adhesive sheet and another adherend A was combined therewith in accordance with JIS Z 0237 to obtain a piece for a peel strength test. This combining procedure was followed by aging for 7 days. The peel strength test piece was then pulled at a rate of 10 mm/min using a tensile tester to measure a T-peel strength in accordance with JIS Z 6854.

(2) Evaluation of Cure Completion Time

Each photocurable pressure-sensitive adhesive sheet was irradiated under the same conditions as used in the test piece fabrication in the peel strength evaluation (1) to fabricate a test piece. After the irradiation, a period of time was measured during which 90% of epoxy groups in the photocurable pressure-sensitive adhesive sheet was consumed. The measured time was recorded as the cure completion time.

A consumption rate of epoxy groups in the photocurable pressure-sensitive adhesive sheet was calculated from an epoxy group content thereof. This epoxy group content was determined by adding a 1:1 ratio by volume of a hydrogen chloride solution in dioxane and ethanol to a predetermined amount of the photocurable pressure-sensitive adhesive sheet, stirring the mixture at room temperature for about 5 hours, and then performing back titration of the remaining hydrogen chloride with potassium hydroxide. The epoxy group content (Z mol/g) was calculated from the following equation:

$$Z(\text{mol/g}) = (S2-S1) \times C \times f / (Ws \times 1{,}000)$$

In the equation, S1, S2, C, f, Ws have the following meanings.

S1 (mL): a titer of an ethanol solution of potassium hydroxide as required in actual determination S2 (mL): a titer of an ethanol solution of potassium hydroxide as required in blank determination C (mol/L): a concentration of an ethanol solution of potassium hydroxide used in the titration f: a factor of an ethanol solution of potassium hydroxide used in the titration Ws (g): an amount of the sample collected In the case where a carboxyl or other acid group is present in the sample, an acid concentration is determined in advance and subtraction of Z from the determined value provides a value for the epoxy group content. In such a case, the epoxy group consumption rate (conversion rate (%)) is calculated from the equation: the epoxy group consumption rate (conversion rate (%))=(Z0−Z1)/Z0×100.

In this equation, Z0(mol/g) and Z1 (mol/g) have the following meanings.

Z0 (mol/g): an epoxy group content of the photocurable pressure-sensitive adhesive sheet prior to being irradiated Z1 (mol/g): an epoxy group content of the photocurable pressure-sensitive adhesive sheet after the lapse of a predetermined time period from irradiation

TABLE 1

| | | Tg of Homopolymer (° C.) | Ex. | | | | | | | | | | | | Comp. Ex. | |
|---|---|---|---|---|---|---|---|---|---|---|---|---|---|---|---|---|
| | | | 1 | 2 | 3 | 4 | 5 | 6 | 7 | 8 | 9 | 10 | 11 | 12 | 1 | 2 |
| Compound (A) | Cyclohexly Acrylate | 15 | 10 | 30 | 50 | 75 | | | | | | 50 | | | | |
| | 3-Phenoxy-2-Hydroxypropyl Acrylate | 17 | | | | | 30 | 50 | | | | 25 | 120 | 40 | | |
| | tert-Butyl Acrylate | 41 | | | | | | | 30 | 50 | | | 180 | 40 | | |
| | Isobornyl Acrylate | 94 | | | | | | | | | 20 | 25 | | 20 | | |
| | 2-Ethylhexyl Acrylate | −85 | | | | | | | | | | | | | | 20 |
| Compound (B) | Tetrahydrofurfuryl Acrylate | | 30 | 30 | 30 | 30 | 30 | 30 | 30 | 30 | 30 | 30 | 30 | 30 | 30 | 30 |
| | Plaxel FM-2D | | 20 | 20 | 20 | 20 | 20 | 20 | 20 | 20 | 20 | 20 | 20 | 20 | 20 | 20 |

TABLE 1-continued

| | | Tg of Homopolymer (°C.) | Ex. 1 | 2 | 3 | 4 | 5 | 6 | 7 | 8 | 9 | 10 | 11 | 12 | Comp. Ex. 1 | 2 |
|---|---|---|---|---|---|---|---|---|---|---|---|---|---|---|---|---|
| Compound (C) | Epoxy Resin 1 (Epicoat 828) | | 30 | 30 | 30 | 30 | 30 | 30 | 30 | 30 | 30 | 30 | 30 | 30 | 30 | 30 |
| | Epoxy Resin 2 (Rikaresin BEO-60E) | | 20 | 20 | 20 | 20 | 20 | 20 | 20 | 20 | 20 | 20 | 20 | 20 | 20 | 20 |
| Compound (E) | Irgacure 1700 | | 0.1 | 0.1 | 0.1 | 0.1 | 0.1 | 0.1 | 0.1 | 0.1 | 0.1 | 0.1 | 0.1 | 0.1 | 0.1 | 0.1 |
| Compound (F) | Optomer SP-170 | | 0.5 | 0.5 | 0.5 | 0.5 | 0.5 | 0.5 | 0.5 | 0.5 | 0.5 | 0.5 | 0.5 | 0.5 | 0.5 | 0.5 |
| Peel Strength | Kgf/25 mm | | 2.6 | 3.7 | 4.8 | 4.0 | 3.1 | 3.9 | 2.9 | 3.5 | 2.5 | 4.2 | 5.9 | 4.8 | 1.6 | 0.2 |
| Cure Completion Time | Hours | | 24 | 24 | 24 | 24 | 24 | 24 | 24 | 24 | 24 | 24 | 24 | 24 | 24 | 24 |

As apparent from Table 1, the adhesive sheet obtained in Comparative Example 1 revealed a low peel strength of 1.6 kgf/25 mm, probably due to the exclusion of the compound (A) and the free-radical polymerization of the compound (B) alone.

In Comparative Example 2, due probably to the use of 2-ethylhexyl acrylate which gives a homopolymer having a glass transition point Tg of −85° C. as the compound (A), the finally obtained cured product also revealed a low peel strength of 0.2 kgf/25 mm.

In contrast, the adhesive sheets obtained in Examples 1–12 revealed comparable cure completion time but superior peel strength compared to those obtained in Comparative Examples 1 and 2, due to the inclusion of the compound (A) which gives a homopolymer having a glass transition point Tg within the range of 0–100° C., the compound (B), the compound (C), the polymerization catalyst (D) and the cationic polymerization catalyst (E).

Effects of the Invention

The photocurable composition in accordance with the invention as recited in claim 1 contains the compound (A) which has a polymerizable unsaturated bond and gives a homopolymer having a glass transition point within the range of 0–100° C., the compound (B) having an unsaturated bond and copolymerizable with the compound (A), the compound (C) having at least one cationically polymerizable group in a molecule, the polymerization catalyst (D) and the cationic photopolymerization catalyst (E). Accordingly, exposure to a radiation that activates the polymerization catalyst (D) initiates polymerization of the compound (A) and the compound (B) to form the copolymer (A3). The photocurable composition in accordance with the invention as recited in claim 5 can thus be readily obtained.

The photocurable composition in accordance with the invention as recited in claim 5, shows pressure-sensitive adhesive properties, attributed to tackiness of the copolymer (A3), which make the composition in its initial condition readily applicable to an adherend. Exposure to a radiation that activates the cationic photopolymerization catalyst (E) initiates curing of the compound (C), so that high bond strength, particularly high peel strength, is imparted to the composition.

In accordance with the present invention which utilizes irradiation, a photocurable composition can be provided which is applicable even to a low heat-resistant adherend, has a long working life and, when cured, exhibits excellent bond strength, particularly peel strength.

Also in accordance with the present invention, the photocurable composition, when rendered into a sheet form, provides a photocurable pressure-sensitive adhesive sheet which when cured exhibits excellent bond strength, particularly peel strength. Further, the use of this photocurable pressure-sensitive adhesive sheet enables easy and firm joint of adherends with high peel strength.

What is claimed is:

1. A photocurable composition comprising:
   (A) a compound which has a polymerizable unsaturated bond and gives a homopolymer having a glass transition point within the range of 0–100° C.;
   (B) a compound which has an unsaturated bond and is copolymerizable with the compound (A);
   (C) a compound having at least one cationically polymerizable group in a molecule;
   (D) a polymerization catalyst which initiates polymerization of the compounds (A) and (B) upon exposure to a radiation; and
   (E) a cationic polymerization catalyst which initiates cationic polymerization of the cationically polymerizable group in the compound (C) upon exposure to a radition;
   wherein said compound (B) contains a compound (B1) having at least one (meth)acryloyl group and at least one hydroxyl group per molecule and a compound (B2) having an unsaturated bond that is copolymerizable with the compound (B1).

2. The photocurable composition of claim 1, wherein the cationically polymerizable group in said compound (C) is an epoxy group.

3. The photocurable composition of claim 1, wherein said polymerization catalyst (D) is activated upon exposure to a radiation that includes a wavelength of 370–800 nm to initiate polymerization of the compounds (A) and (B), and said cationic polymerization catalyst (E) is activated upon exposure to a radiation that includes a wavelength of not below 300 nm but below 370 nm to initiate polymerization of the cationically polymerizable group in compound (C).

4. A photocurable composition characterized as containing:
   (A3) a copolymer composed of said compound (A) and compound (B) as recited in claim 1;
   (C) a compound having at least one cationically polymerizable group in a molecule; and
   (E) a cationic polymerization catalyst which initiates cationic polymerization of the cationically polymerizable group in the compound (C) upon exposure to radiation.

5. A process for production of a photocurable composition comprising exposing the photocurable composition of claim 1 to a radiation that activates the polymerization catalyst (D) alone so that the compound (A) and the compound (B) polymerize into the copolymer (A3).

6. A photocurable pressure-sensitive adhesive sheet characterized as being made by rendering the photocurable composition as recited in claim 4 into a sheet form.

7. A process of production of a photocurable pressure-sensitive adhesive sheet comprising applying the photocurable composition of claim 1 and then exposing the applied composition to a radiation that activates the polymerization catalyst (D) alone to initiate polymerization of the compounds (A) and (B) so that the copolymer (A3) composed of the compound (A) and the compound (B) is obtained.

8. A joining method characterized as comprising exposing the photocurable pressure-sensitive adhesive sheet as recited in claim 6, either before or after application to an adherend, to a radiation having a wavelength of not below 300 nm but below 370 nm for activating the compound (E), and then combining the adherend with another adherend.

9. The photocurable composition of claim 2, wherein said polymerization catalyst (D) is activated upon exposure to a radiation that includes a wavelength of 370–800 nm to initiate polymerization of the compounds (A) and (B), and said cationic polymerization catalyst (E) is activated upon exposure to a radiation that includes a wavelength of not below 300 nm but below 370 nm to initiate polymerization of the cationically polymerizable group in compound (C).

10. A process for production of a photocurable composition comprising exposing the photocurable composition of claim 2 to a radiation that activates the polymerization catalyst (D) alone so that the compound (A) and the compound (B) polymerize into the copolymer (A3).

11. A process for production of a photocurable composition comprising exposing the photocurable composition of claim 3 to a radiation that activates the polymerization catalyst (D) alone so that the compound (A) and the compound (B) polymerize into the copolymer (A3).

12. A process of production of a photocurable pressure-sensitive adhesive sheet comprising the photocurable composition of claim 2 and then exposing the applied composition to a radiation that activates the polymerization catalyst (D) alone to initiate polymerization of the compounds (A) and (B) so that the copolymer (A3) composed of the compound (A) and the compound (B) is obtained.

13. A process of production of a photocurable pressure-sensitive adhesive sheet comprising applying the photocurable composition of claim 3 and then exposing the applied composition to a radiation that activates the polymerization catalyst (D) alone to initiate polymerization of the compounds (A) and (B) so that the copolymer (A3) composed of the compound (A) and the compound (B) is obtained.

* * * * *